United States Patent
Ortega et al.

[19]

[11] Patent Number: 6,123,554
[45] Date of Patent: Sep. 26, 2000

[54] CONNECTOR COVER WITH BOARD STIFFENER

[75] Inventors: Jose L. Ortega, Camp Hill; Stuart C. Stoner, Lewisberry, both of Pa.

[73] Assignee: BERG Technology, Inc., Reno, Nev.

[21] Appl. No.: 09/321,630

[22] Filed: May 28, 1999

[51] Int. Cl.[7] ............................. H01R 13/60; H01R 13/66
[52] U.S. Cl. ............................................. 439/79; 439/701
[58] Field of Search ................................... 439/532, 108, 439/540.1, 701, 608

[56] References Cited

U.S. PATENT DOCUMENTS

| | | | |
|---|---|---|---|
| 4,134,632 | 1/1979 | Lindberg et al. . | |
| 4,428,640 | 1/1984 | Pittman . | |
| 4,655,518 | 4/1987 | Johnson et al. . | |
| 4,737,888 | 4/1988 | Bodnar et al. | 361/427 |
| 4,869,677 | 9/1989 | Johnson et al. | 439/80 |
| 4,881,901 | 11/1989 | Mendenhall et al. | 439/65 |
| 4,909,743 | 3/1990 | Johnson et al. | 439/60 |
| 4,952,172 | 8/1990 | Barkus et al. | 439/532 |
| 5,104,341 | 4/1992 | Gilissen et al. | 439/608 |
| 5,105,339 | 4/1992 | Olsson et al. | 361/399 |
| 5,139,426 | 8/1992 | Barkus et al. | 439/65 |
| 5,158,471 | 10/1992 | Fedder et al. | 439/80 |
| 5,184,961 | 2/1993 | Ramirez et al. | 439/59 |
| 5,186,377 | 2/1993 | Rawson et al. | 228/37 |
| 5,198,279 | 3/1993 | Beinhaur et al. | 428/99 |
| 5,199,886 | 4/1993 | Patterson | 439/79 |
| 5,304,069 | 4/1994 | Brunker et al. | 439/108 |
| 5,405,267 | 4/1995 | Koegel et al. | 439/79 |
| 5,451,158 | 9/1995 | Lin et al. | 439/79 |
| 5,484,310 | 1/1996 | McNamara et al. | 439/608 |
| 5,492,479 | 2/1996 | Ortega | 439/79 |
| 5,668,154 | 9/1997 | Bumsted et al. | 439/79 |
| 5,672,064 | 9/1997 | Provencher et al. | 439/79 |
| 5,676,569 | 10/1997 | Davis | 439/731 |
| 5,679,009 | 10/1997 | Okumura et al. | 439/79 |
| 5,702,258 | 12/1997 | Provencher et al. | 439/79 |
| 5,795,191 | 8/1998 | Preputnick et al. | 439/608 |

OTHER PUBLICATIONS

Brochure: Backplane Assemblies and Connectors, Teradyne: Products, Dec. 31, 1997, 5 pages.

*Primary Examiner*—Neil Abrams
*Assistant Examiner*—Hae Moon Hyeon
*Attorney, Agent, or Firm*—Woodcock Washburn Kurtz Mackiewicz & Norris LLP

[57] ABSTRACT

An electrical connector and method for mechanically supporting the main body of a connector module to a daughterboard Printed Circuit Board (PCB) in a manner that also allows attachment of a zero-footprint board stiffener thereby eliminating the need to take up valuable real estate on the PCB. The stiffener rail, by attaching to the cover, has the desired feature of not requiring typical board stiffener mounting holes located on the PCB, as is he case with a typical edge mounted connector. This feature conserves space on the PCB and eliminates trace routing problems caused by these typical stiffener mounting holes. In addition to the board stiffener not requiring mounting holes on the PCB, this improvement simultaneously aligns the connector modules to each other creating a one piece "mono-block" like effect while at the same time acting to stiffen the PCB thereby reducing any PCB bowing. Alternatively, an electrical connector and method for mechanically supporting the main body of a connector module to a daughterboard Printed Circuit Board (PCB) in a manner that also allows attachment of a minimum-footprint board stiffener thereby eliminating the need to take up valuable real estate on the PCB.

19 Claims, 11 Drawing Sheets

CONNECTOR COVER WITH BOARD STIFFENER

RELATED APPLICATIONS

This application is related to pending U.S. patent application Ser. No. 09/295,504, filed on Apr. 21, 1999, which is hereby incorporated by reference.

FIELD OF THE INVENTION

This invention relates generally to electrical connectors for connecting a first circuit substrate, such as a daughter Printed Circuit Board (PCB) to a second circuit substrate, such as a backplane. More particularly, the present invention relates to an apparatus and method of mechanically supporting an electrical connector to a PCB.

BACKGROUND

Electrical connector pairs are commonly used in electronic equipment. Each pair functions to connect and route electrical signals between different PCBs. A typical connector pair consists of a plug, or header, and a receptacle, each including a plastic housing and multiple contact elements. The complimentary shaped plug and receptacle fit together, such that the electrical contacts of the plug are aligned with the electrical contacts of the receptacle. Each contact is provided with a tail portion that extends beyond the plastic housing to engage, for example, a plated through hole in the PCB. The plug and receptacle are attached to separate PCBs, such that the tail portions of each connector make contact with conductive traces formed on or in each PCB. In this manner, a connector pair completes an electrical circuit between the two PCBs. For instance, these type connectors have been used to electrically connect a daughterboard to another daughterboard, to a backplane board, or to other electrical circuitry. In a typical configuration, the receptacle is connected to the daughterboard while the plug is attached to the backplane.

One early limitation in the use of electrical connectors of this type was in maintaining tolerances for the proper alignment of the contact elements of each connector. This problem has been addressed through the development and use of multiple modules in a single connector. Since each individual module is smaller in size than the entire connector and plastic housing, it is easier to maintain manufacturing tolerances within acceptable limits, thereby ensuring that the plug and receptacle elements fit together properly and that the contacts establish an acceptable electrical connection.

The current United States industry standard for a two part modular connector system for electrically coupling a backplane to a daughter board is set out in specification EIA/IS-64 from the Electronic Industries Association. This specification delineates parameters for 2 mm, two part connectors for use with PCBs and backplanes. The international standard for these two part connectors is set out in IEC 1076-4-001 specification 48B.38.1. Both of these specifications define a free board (daughter board) connector that contains receptacle contacts and a fixed board (backplane or mother board) connector that contains pin contacts. The connector half containing receptacle contacts is commonly referred to as a socket connector, and the connector half containing pin contacts is commonly referred to as a header connector.

The use of stiffeners to help hold the individual connector modules together is known to maintain the correct tolerances and alignment between modules, and to help reduce bowing of the PCB. Alignment problems usually result from a difference in thermal expansion between the materials used in the modules and the PCB. When the assembly is heated during a soldering operation, the thermoplastic housing material of the connector can expand at a faster rate than the PCB material. A typical PCB is made from a composite of fiberglass/epoxy resin and contains copper traces with plated through holes or pads. Built-in residual stresses from the connector manufacturing and assembly processes are released by the heat generated during this soldering process. As a result, the components may not return to their original position after they have cooled down. This can result in misalignment of the connector tails when attached by the soldering process. This misalignment causes the more rigid connector housing to pull on the holes of the PCB through the metal contact tails, flexing the less rigid structure of the PCB to the alignment of the connector assembly. The longer the connector, the more this misalignment effect is compounded. The presence of numerous through holes in the PCB also introduces a less rigid area to the PCB which is more prone to flex during loading. Accordingly, stiffeners have become popular in these types of connector assemblies.

Traditional board stiffeners consist of an angled bar, shell, or U-shaped bar. The board stiffener is typically bolted or screwed to the PCB. In other applications, the stiffener is connected to both the connector and the PCB. Stiffeners are usually made from metallic material. These metal stiffeners have a much stronger stiffness when compared to the plastic housing of the connector or the composite material of the PCB. As a consequence, the stiffener helps to reduce the bowing effect. However, these board stiffeners also have several problems or design disadvantages. One such problem is the increased assembly cost.

A design problem resulting from the use of a stiffener is that the stiffener requires valuable board real estate, i.e., space on the PCB. Attempts to solve the space problem are disclosed in U.S. Pat. No. 5,492,479 (Ortega) which discloses a stiffener having an L-shaped body wherein one leg of the stiffener abuts an outward edge of the PCB and the other leg abuts a surface of the PCB adjacent to the end edge. This stiffener addresses the problem of conserving real estate on the surface of the PCB due to the fact that the stiffener leg is adapted to be attached under the connectors and not behind or adjacent to the connectors. The resulting connector/stiffener assembly is then secured to the PCB using traditional methods.

Another attempt to solve the problem of conserving PCB real estate can be seen in U.S. Pat. No. 5,672,064 (Provencher et al.) which illustrates the use of a stiffener and mounting blocks. Connector modules are held rigidly to the stiffener by the use of slots on one surface of the modules, which slots are adapted to receive barbs formed on the stiffener and hubs on the other surface of the connector which hubs are adapted to be press fit into holes in the stiffener. This design also attempts to solve the problem of conserving real estate by having a stiffener in which no significant surface of the stiffener comes into contact with or abuts the PCB surface. The resulting connector/stiffener assembly is then secured to the PCB using traditional methods.

However, since both of the prior stiffeners are still attached to the PCB in the traditional manner of bolting or screwing, surface area on the PCB is still required to provide stiffener mounting holes as a means of attaching the stiffener to the PCB. This again requires valuable PCB real estate and also creates trace routing problems because the traces running from the edge of the board have to be routed around the stiffener mounting holes.

Accordingly, a need still exists for providing means of connecting together and holding down various connectors, and of providing a means of stiffening the PCB to prevent bowing while minimizing the usage of space on the PCB.

SUMMARY

The present invention is directed to a connector cover with a board stiffener. This invention solves the need of providing a means of connecting together various connector modules, and also of providing the advantage of aligning the connector modules in a mono-block appearance. The invention also provides a means of stiffening the Printed Circuit Board (PCB) to prevent bowing, while at the same time, conserving space or real estate on the PCB. It also minimizes trace routing problems, associated with traditional methods of securing connector modules and stiffeners to a PCB, by either attaching the stiffener directly to the connector cover and not the PCB, or, in embodiments where the stiffener is coupled to the PCB, by locating any mounting bolts that may be used in an area between individual connector modules where traces of the PCB are minimal.

According to one aspect of the present invention, an apparatus and method are disclosed for mechanically supporting the main body of a connector module to a daughterboard PCB in such a manner that allows attachment of a "zero footprint" board stiffener that eliminates the need to take up valuable PCB real estate. The stiffener, by attaching directly to a cover, has the desired effect of not requiring typical board stiffener mounting holes that are required to be located behind a traditional edge mounted connector.

In a further aspect of the invention where board stiffener mounting holes are used, the footprint of the board stiffening rail is located to minimize the use of valuable PCB real estate and minimize trace routing problems. This embodiment uses a minimal footprint board stiffener that minimizes the need to take up valuable PCB real estate. In this embodiment, the stiffener mounting holes are located in areas that have lower density of traces, such as the area between individual connector modules.

In accordance with a further aspect of the present invention, the cover and stiffener act to simultaneously align a plurality of connector modules and cover assemblies to one other, creating a one-piece "mono-block" like effect. The stiffener may have a length sufficient to connect and align a plurality of connector modules and cover assemblies.

This invention also acts to reduce any PCB bowing. This strengthening and stiffening of the PCB is accomplished indirectly, thereby conserving space on the PCB. This is accomplished by connecting the stiffener directly to the cover, and not to the PCB. The substantially rigid structure of the cover and the positive mechanical connection of the cover to the PCB, allows the stiffener to indirectly strengthen and stiffen the PCB via the connector cover.

BRIEF DESCRIPTION OF THE DRAWINGS

These and other features, aspects, and advantages of the present embodiment of the invention will become better understood with regards to the following description, appended claims, and accompanying drawings where:

DETAILED DESCRIPTION OF THE PREFERRED EMBODIMENTS

Figure 6:
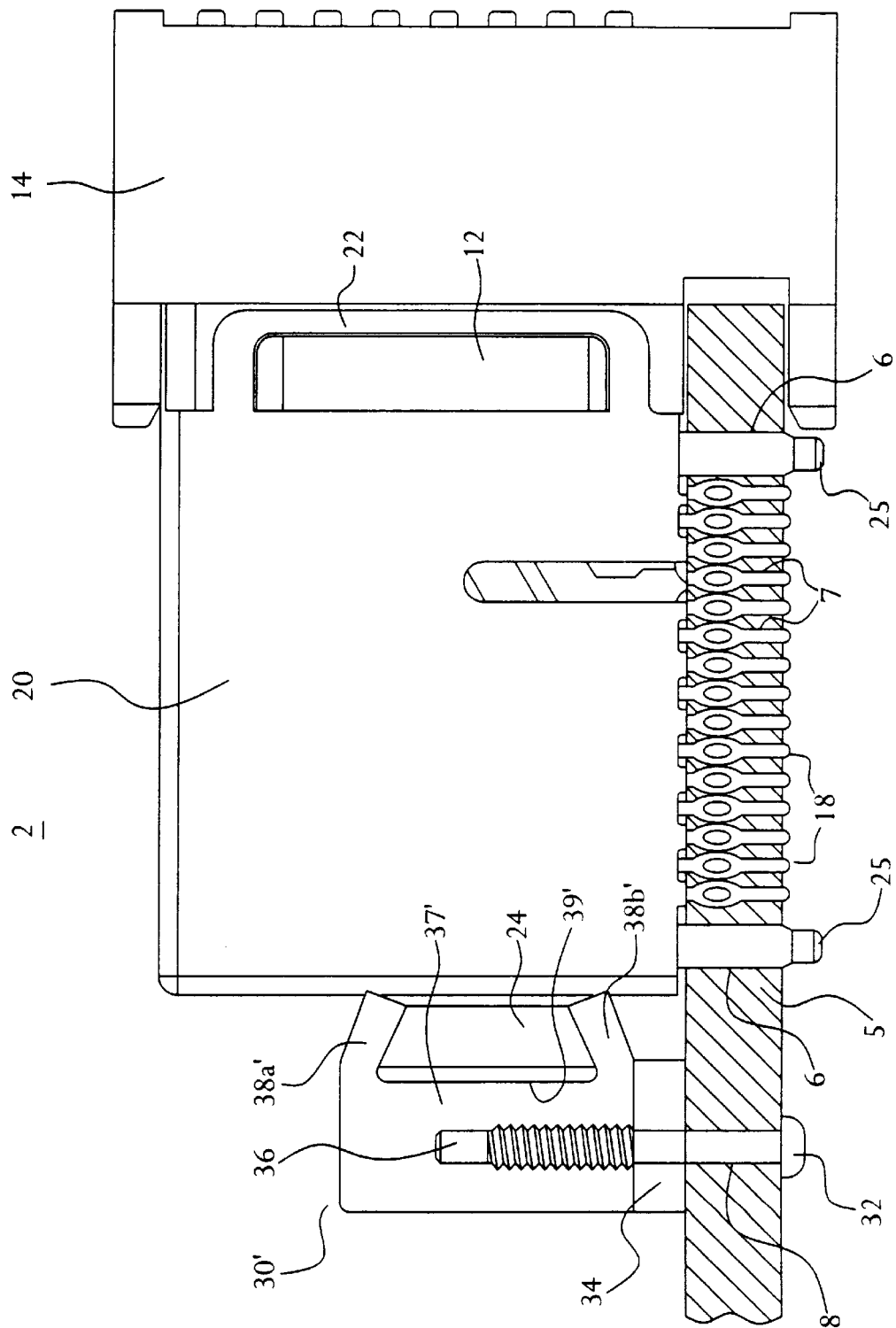
FIG. 6 is a side view of a second alternative exemplary embodiment of the present invention having the stiffener mechanically connected to the cover and the PCB.
Figure 7:
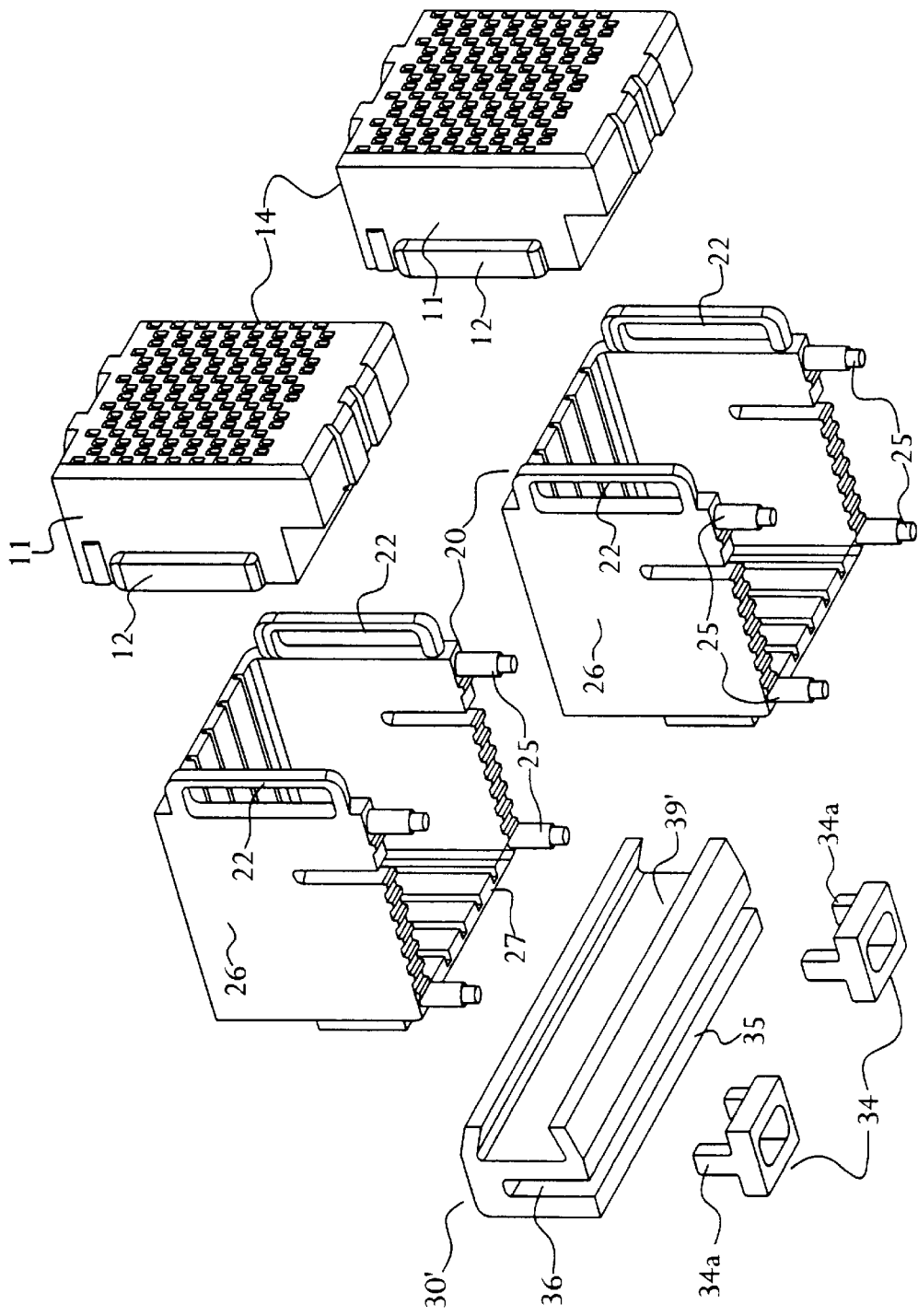
FIG. 7 is a bottom exploded perspective view of the electrical connector assembly of FIG. 6.

Throughout the following detailed description similar reference numbers refer to similar elements in all the figures of the drawings. With reference to FIGS. 1 through 5, shown is a first preferred embodiment of an electrical connector cover with a board stiffener assembly in accordance with the present invention. In this embodiment, the stiffener attaches to a structure of the cover and does not secure to the Printed Circuit Board (PCB). With reference to FIGS. 6 through 7, shown is a second alternative embodiment of an electrical connector cover with a board stiffener assembly. In this second embodiment, the stiffener assembly mechanically attaches to the cover and also to the PCB. FIGS. 8 through 11 show a third alternative embodiment of an electrical connector cover and board stiffener assembly. In this third embodiment, the cover has a split body with an alternative exemplary board stiffener that attaches directly to the cover and does not directly connect to the PCB.

FIGS. 1 through 5 show an exemplary electrical connector 2 constructed in accordance with a first embodiment of the present invention. Connector 2 could be the connector described in pending U.S. patent application Ser. No. 09/295,504, filed on Apr. 21, 1999, or any other suitable connector. As shown, each electrical connector 2 includes a plurality of connector sub-assembly modules 10, a rear cover 20 and a front housing 14. Cover 20 and housing 14, when secured together, retain modules 10 therein. A series of connectors 2 positioned side-by-side for engagement by a stiffener 30 form a larger connector assembly or connection system 3. Each cover 20 has features for forming a mechanical connection to the PCB 5. The stiffener 30 exhibits a stiffening effect which is operative on the cover 20, and the stiffening effect is transposed through the cover 20 to help rigidify the PCB 5. This transposed stiffening effect helps to stiffen the PCB 5 and minimizes bowing of the PCB 5. Each electrical connector 2 is adapted to be mechanically and electrically connected to a PCB 5, preferably using known techniques.

The connection system 3 mountable on a circuit substrate 5 includes a plurality of electrical connectors 2 arranged adjacently, each connector 2 including a body 14,20 having a retention structure 24 formed thereon. A stiffener 30 located away from the circuit substrate 5 and having an alignment structure 39 corresponding to the retention structure 24 is used for securing together the connectors 2.

Preferably, the stiffener does not engage the substrate 5, or alternatively, the stiffener 30 indirectly engages the substrate 5.

Figure 2:
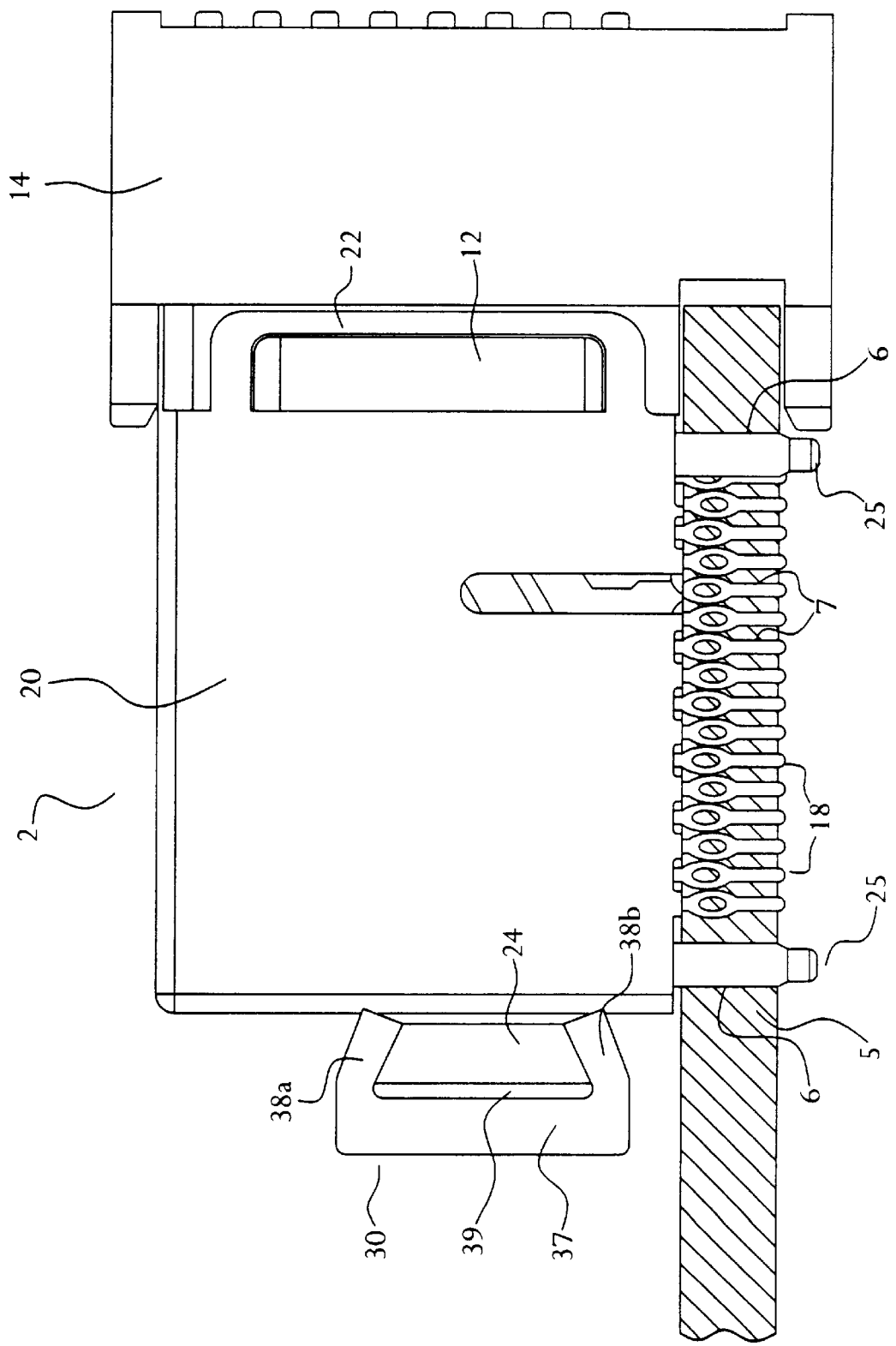
FIG. 2 is a reverse side view of the electrical connector assembly of FIG. 1.

As shown in FIG. 2, PCB 5 is provided with a plurality of through holes 6 for receiving mounting projections 25 extending from the cover 20 to form a mechanical connection therebetween. PCB 5 also includes electrically conductive, plated through holes 7 (or alternatively contact pads) adapted for establishing an electrical connection with terminal tails 18 extending from modules 10. PCB 5 can have suitable traces (not shown) disposed thereon for ground or transmitting signals.

As shown in FIGS. 1 through 5, the connectors 2 comprises a socket housing 14 having an arrangement of lead-in openings that correspond to the electrical contacts 16a, such as for example signal terminals in modules 10. In a traditional arrangement, the openings could have eight rows and twenty-four columns on two millimeter centerlines.

Housing 14 also includes a locking projection or shoulder 12 for establishing a mechanical connection with cover 20. Preferably, shoulder 12 is designed to be received within and mechanically engage a corresponding latch 22 on cover 20. Each side wall 11 of socket housing 14 can have at least one shoulder 12 disposed proximate a rear edge 13. Shoulder 12 may be formed uniform in height and thickness or may be formed such that at least a portion of shoulder 12 has a non-uniform height and thickness, such as a ramp type structure, to facilitate the installation of the cover 20 over shoulders 12. It should be understood that any other suitable connecting means may be employed to connect the cover 20 to the connector module 10, such as pegs, dowel pins, screws, bolts, clips, interference fit, keys, slots, etc.

Housing 14 can have features, such as a tapered shoulder 12 or providing a projection on the outer surface of housing 14 that is formed separate from the shoulder 12 to facilitate the installation of the cover 20 onto housing 14 by non-permanently deforming the side panels 26 of cover 20 as the latch 22 slides over the shoulder 12. Once the latch 22 is disposed over the shoulder 12, the side panels 26 return to their original shape and connectively engages the cover 20 on the housing 14 thereby retaining the modules 10.

Figure 3:
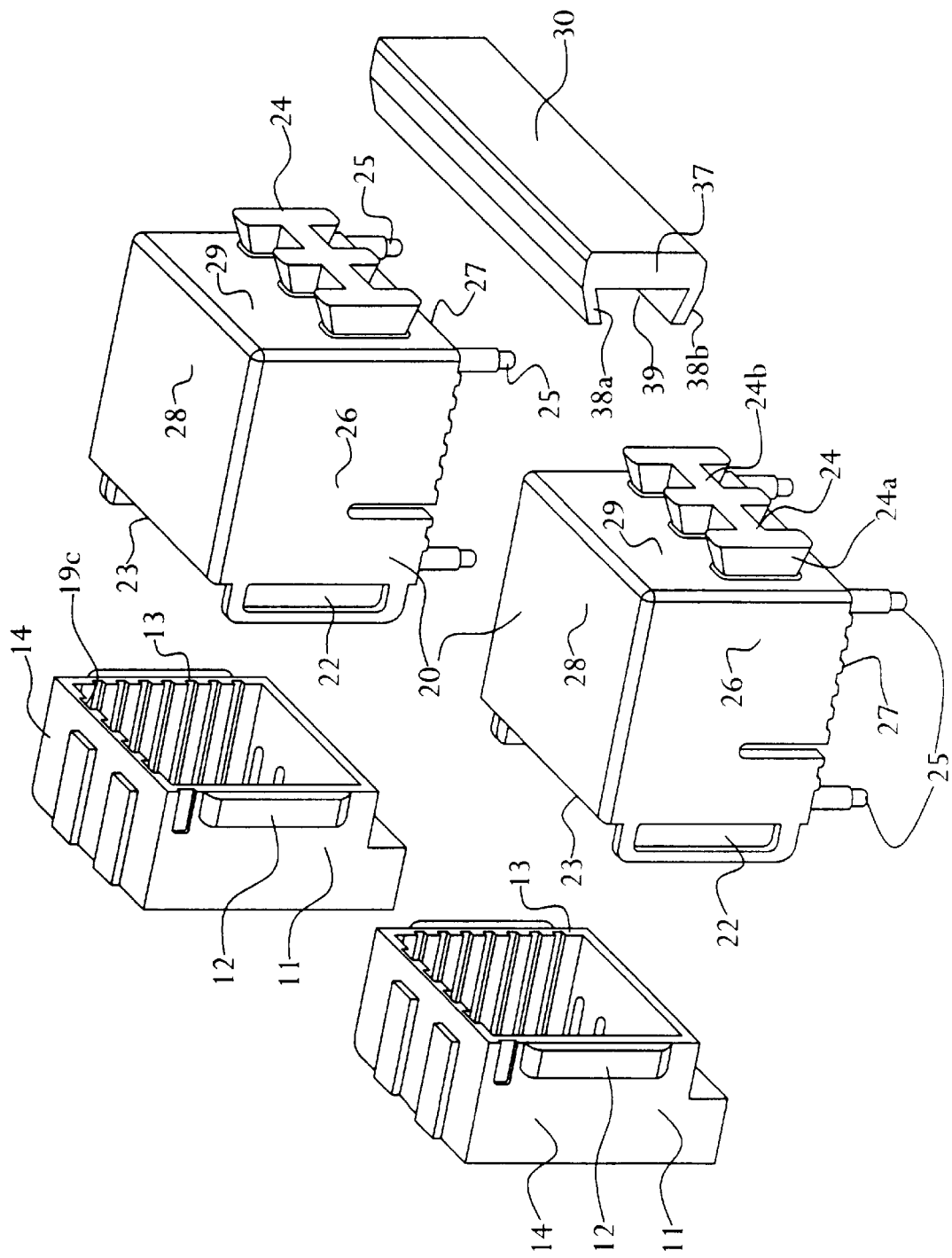
FIG. 3 is an exploded perspective view of the electrical connector assembly of FIG. 1.

Referring to FIG. 3, the cover 20 includes two side panels 26, a top panel 28, and a back panel 29. A front 23 and a bottom 27 are generally open. The cover 20 is adapted to receive modules 10 in the open area between the panels 26 and for forming a mechanical connection to a PCB 5. Cover 20 preferably forms a substantially rigid box-like structure. Preferably, cover 20 is made from an electrically insulative and pliable material, such as a plastic or thermo plastic material. It is desired that the material of cover 20 have some flexibility to allow the side panels 26 may deflect outward as the latches 22 slide over the shoulders 12 on housing 14 of the connector 2 while at the same time having a memory so that it returns to its original shape once the latches 22 are fitted over the shoulders 12. Cover 20 may also be constructed of a metal material, such as a zinc-die material. Preferably where a metal material is used, the metal material allows some flexibility to facilitate the installation of cover 20 over the modules 10 of connector 2.

Figure 4:
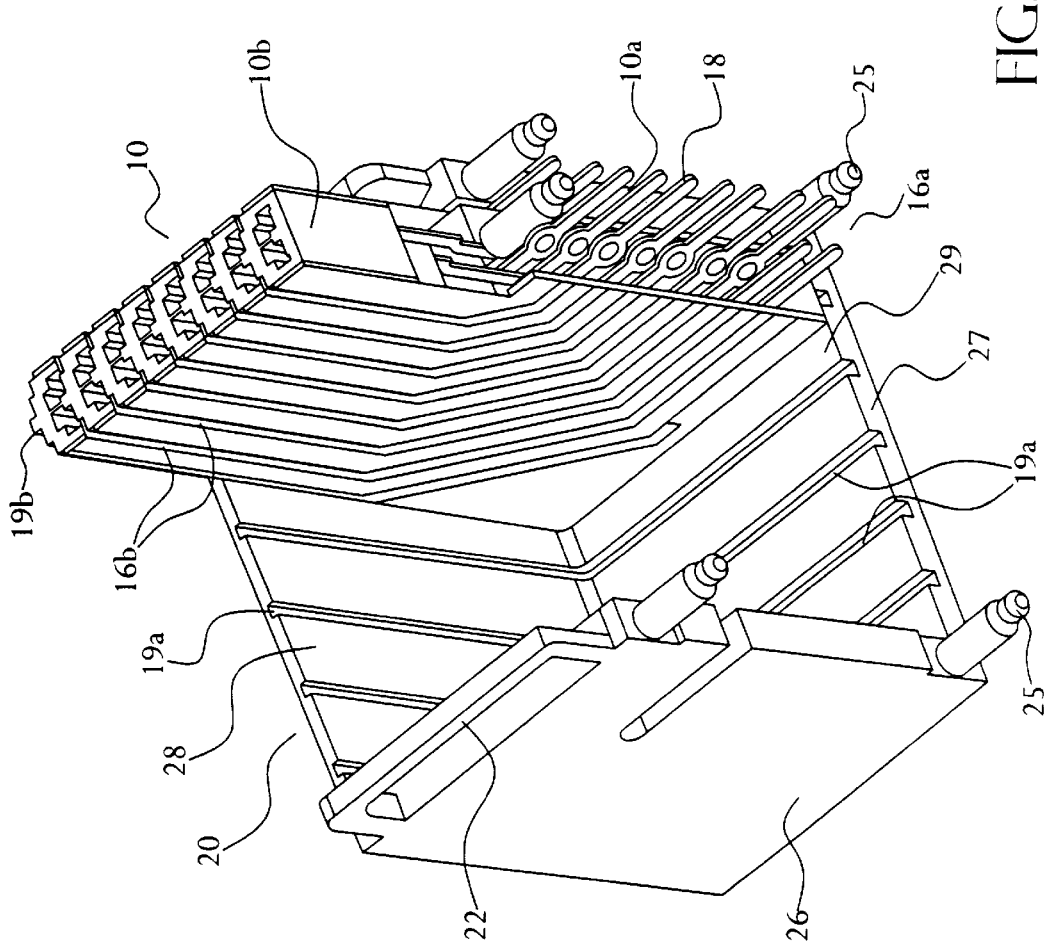
FIG. 4 is a bottom perspective view of one cover of FIG. 1 showing a typical column of receptacle contacts.
Figure 5:
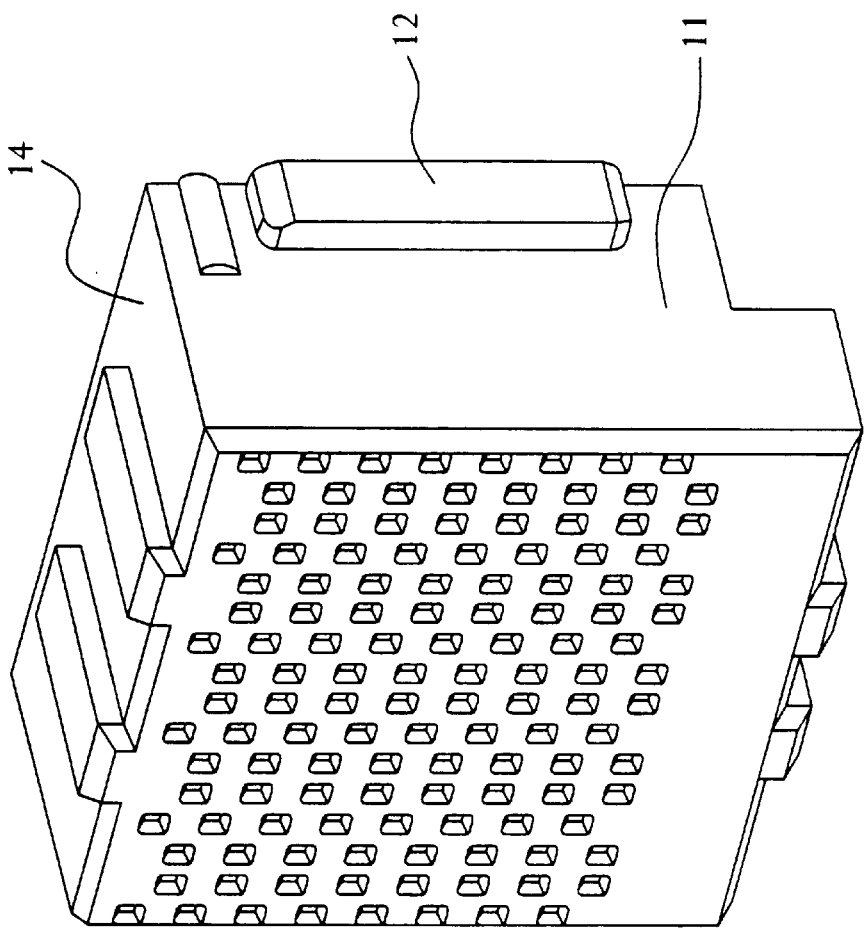
FIG. 5 is a perspective view of the connector module of FIG. 1 showing an optional spreading structure.

Referring to FIG. 4, an alignment structure 19a may be formed on the cover 20. As shown in FIG. 4, the alignment structure could be grooves or slots 19a that receive ribs 19b from modules 10 to position, align, and affix modules 10 within cover 20. Preferably, slots 19a are formed along the inside of the top panel 28 and the back panel 29 of the cover 20 in a direction parallel to the side panels 26. Slots 19a formed on the inside of cover 20 correspond and mate with a plurality of accompanying ribs 19b formed on the connector modules 10 to help align and attach the cover 20 to the connector modules 10. As can be seen in FIG. 3, housing 14 has similar grooves 19c for retaining the modules 10.

Connector cover 20 also includes a plurality of mounting projections 25. Preferably, mounting projections 25 include a peg or dowel designs. Projections 25 may be formed separate from, or preferably are formed integral with cover 20, and extend from the bottom 27 of cover 20. In a preferred embodiment, pegs 25 are sized to form an interference fit or press-fit with corresponding through holes 6 formed in PCB 5. The pegs 25 may be pressed into the PCB 5 using a vice or seating tool. The mounting projections 25 may form either a removable or non-removable attachment of the cover 20 to the PCB 5. The number of mounting projections varies depending on the particular application and is predetermined to provide a sufficient retention force to support and hold the connector 2 to the PCB 5 while at the same time transposing the stiffening effect of the stiffener 30 to the PCB 5.

Modules 10 house the contacts 16a, such as for example signal terminals that electrically connect PCB 5 to another PCB. In the high-speed, differential pair application shown in FIG. 4, module 10 has signal terminals 16a arranged in pairs and ground terminals 16b flanking the signal terminals 16a. Signal terminals 16a partially reside in an over-molded body 10a. A proximal, or mounting, end of signal terminals 16a extend from body 10a to engage PCB 5.

A distal, or mating, end of the signal terminal 16a extend from body 10a to engage, for example, pins (not shown) on a mating header (not shown). A pre-molded body 10b having apertures formed therein receives the distal ends of signal terminals 16a for support. The apertures in body 10b align with certain of the lead-in openings in housing 14.

Ground terminals 16b seat within channels formed in bodies 10a,b. A proximal, or mounting, end of the ground terminals 16b engage PCB 5. A distal, or mating, end of ground terminal 16b align with certain of the lead-in openings in housing 14 to engage the pins of the mating header. Once assembled as now described, the modules 10 can be placed side-by-side between the cover 20 and the housing 14 to form connector 2.

The stiffener 30 is adapted to be connected to the assembled connector 2. The stiffener may be attached directly to body 14,20 of the connector 2 using any suitable conventional attachment techniques, such as screws, clips, dowels, bolts, etc. Preferably, the stiffener 30 includes an alignment structure or recess 39 which corresponds to and is attached to a retention structure 24 disposed on the back panel 29 of cover 20 to form an interference fit. Preferably, stiffener 30 is made out of a material that is stiffer than the material of the PCB 5, such as a metallic material. More preferably, the stiffener 30 is an aluminum material. The use of a metal stiffener 30 is desired because of its stiffening and strength characteristics. However, it is within the scope of the invention for the stiffener 30 to be formed from other materials.

A retention structure 24 includes a projection extending from one surface of the body 14,20. The retention structure 24 is constructed to connectively receive a stiffener 30. Structure 24 may be formed separate from the body 14,20 and then fastened thereto, or preferably is formed integral with the body 14,20. In a preferred embodiment, the retention structure 24 has a series of protruded shaped flanges 24a connected by a central web 24b, as shown in FIG. 3.

In a first preferred embodiment shown in FIGS. 1 through 5, the stiffener 30 is connected directly to cover 20 and is not connected to the PCB 5. In this exemplary embodiment, the stiffener 30 includes a body 37, a first leg 38a, and a second leg 38b that define a recess or channel 39. Channel 39 is shaped to correspond to flanges 24a and slides over structure 24 from the side so that structure 24 structurally fits within channel 39, and connectively receives the stiffener 30 on structure 24. This design forms a snug or an interference fit of the stiffener 30 to the retention structure 24. By not directly attaching stiffener 30 to PCB 5, valuable space on the PCB 5 may be conserved and trace routing problems avoided.

Preferably, each electrical connector 2 has a relatively small size in relation to the completed larger electrical connector assembly 3 which typically includes a plurality of an electrical connectors 2 that are connected together. A stiffener 30 is preferably used to assemble individual connectors 2 together by positioning the electrical connectors 2 together for engagement by the stiffener 30. The same size or various sized connectors 2 may be joined together by a single stiffener 30 merely by ensuring that a common size of retention structure 24 is used on all connectors 2.

Figure 1:
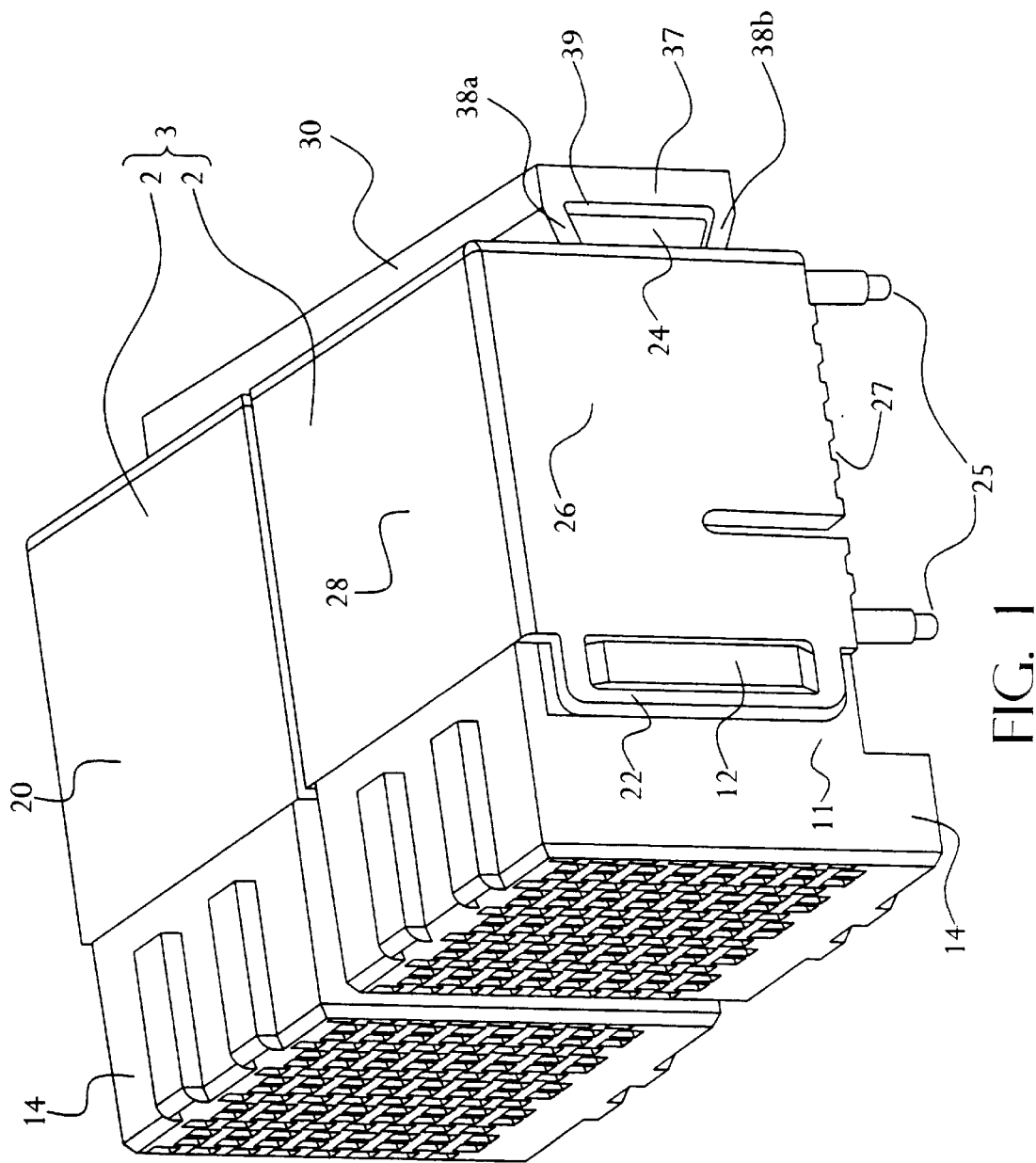
FIG. 1 is a perspective view of an exemplary embodiment of an electrical connector assembly of the present invention for connecting a PCB and a mating receptacle connector.

It is preferred that the attachment of the connector cover 20 to the PCB 5 have sufficient strength such that the characteristics of the stiffener 30 are transferred to the PCB 5, thereby stiffening the PCB 5. The interaction of stiffener 30 and connector cover 20 act to organize and align the connectors 2 on the PCB 5 without occupying any space on the PCB 5. Stiffener 30 functions to align, stiffen, and hold a plurality of connectors 2 together to form a mono-block like appearance. As seen in FIG. 1, stiffener 30 is connected to the cover 20 and does not directly secure to the PCB 5.

FIGS. 6 and 7 show a second exemplary electrical connector 2 constructed in accordance with a second alternative embodiment of the invention. The second embodiment of the invention is similar to the first embodiment in that the connector 2 includes a plurality of connector sub-assembly modules 10 that are retained by a rear cover 20 and a front housing 14. A series of connectors 2 are positioned side-by-side for engagement by a stiffener 30 thereby forming a larger connector 3. However, in a second alternate embodiment, the stiffener 30 is directly attached to the PCB 5.

In addition to the through holes 6 for receiving mounting projections 25, the electrically conductive, plated through holes 7 (or contact pads) adapted for establishing an electrical connection with terminal tails 18 extending from modules 10, and the traces (not shown) disposed thereon for ground or transmitting signals, PCB 5 has a plurality of through holes 8 for mechanically connecting the stiffener 30 to the PCB 5. This feature is provided for those applications where it is desired to attach the stiffener 30 to PCB 5 in order to provide added rigidity to the PCB 5, such as applications requiring large connector assemblies 3.

In the second preferred embodiment, the stiffener 30' is adapted to form a mechanical connection to the cover 20 and also to the PCB 5. The stiffener 30' is first connected to the cover 20, as described above. The stiffener 30' is then attached to the PCB 5.

As described in the first embodiment, the stiffener 30' includes a body 37', a first leg 38a', and a second leg 38b' that define channel 39'. Differently than the first embodiment, however, stiffener 30' includes a plurality of slots (not shown), or preferably a single elongated slot 36 that extends substantially the entire length of stiffener 30'.

Preferably, slot 36 opens toward the PCB 5 when the stiffener 30' is attached to the cover 20.

One or more attachment fasteners 32 may be employed in an application where stiffener 30' is directly attached to PCB 5. For example, the fastener 32 is passed through a board opening 8 in PCB 5 and threaded into the side walls of slot 36. Preferably, fastener 32 comprises a bolt or screw type fasteners Stiffener 30' may be designed so that a bottom portion 35 of the stiffener extends down and physically touches PCB 5, or preferably a guide or standoff support bushing 34 is disposed between the stiffener 30' and the PCB 5, as shown in FIG. 6. Bushing 34 has posts 34a which can extend into slot 36. Posts 34a help align stiffener 30' with the openings 8 in PCB 5.

By having elongated slot 36 extend substantially along the length of stiffener 30', the attachment member 32 may then be disposed anywhere along the length of stiffener 30'. Attachment member 32 may connect to PCB 5 anywhere along elongated slot 36. Preferably, in order to selectively utilize less valuable board real estate, the stiffener 30 is affixed to the PCB 5 proximate an area between the adjacent individual connectors 2.

In other words, the preferred location for any through holes 8 formed in the PCB 5 is defined by the space between individual connectors 2, at the seams of the side walls 11 of individual connectors and side panels 26 of covers 20. This location is preferred because generally there are no traces, or fewer traces, at this location on PCB 5 and therefore less trace routing problems are encountered due to interferences with attachment fastener 32. However, as discussed earlier, attachment member 32 could mount to PCB 5 wherever no, or a lower concentration of, traces exist.

FIGS. 8 through 11 show an exploded perspective view of a connector 2 with modules 10, housing 14, cover 60, and stiffener 80 in accordance with a third alternative embodiment of the present invention. As shown, the exemplary large connector assembly 3 includes a plurality of connectors 2 positioned side-by-side for engagement by a stiffener rail 80. Each connector 2 includes a plurality of connector modules 10, a two-piece rear cover 60 and a front housing 14 adapted for retaining the modules 10.

Connector 2 has a similar design as described above, including a housing 14 having an arrangement of lead-in apertures corresponding to the location of the contacts 16a, such as for example signal terminals in modules 10. Connector 2 further comprises shoulders 12 for receiving and connectively engaging the cover 60. Shoulders 12 are preferably formed on side walls 11 of the connector housing 14. Preferably, shoulders 12 are located on the rear edge 13 of the socket housing 14 and have a rectangular shape. Shoulders 12 are sized to mechanically engage latches 65 formed on cover 60. Again, it should be understood that any other suitable connecting means may be employed to connect the cover 60 to the connector housing 14 for retaining the modules 10.

Figure 8:
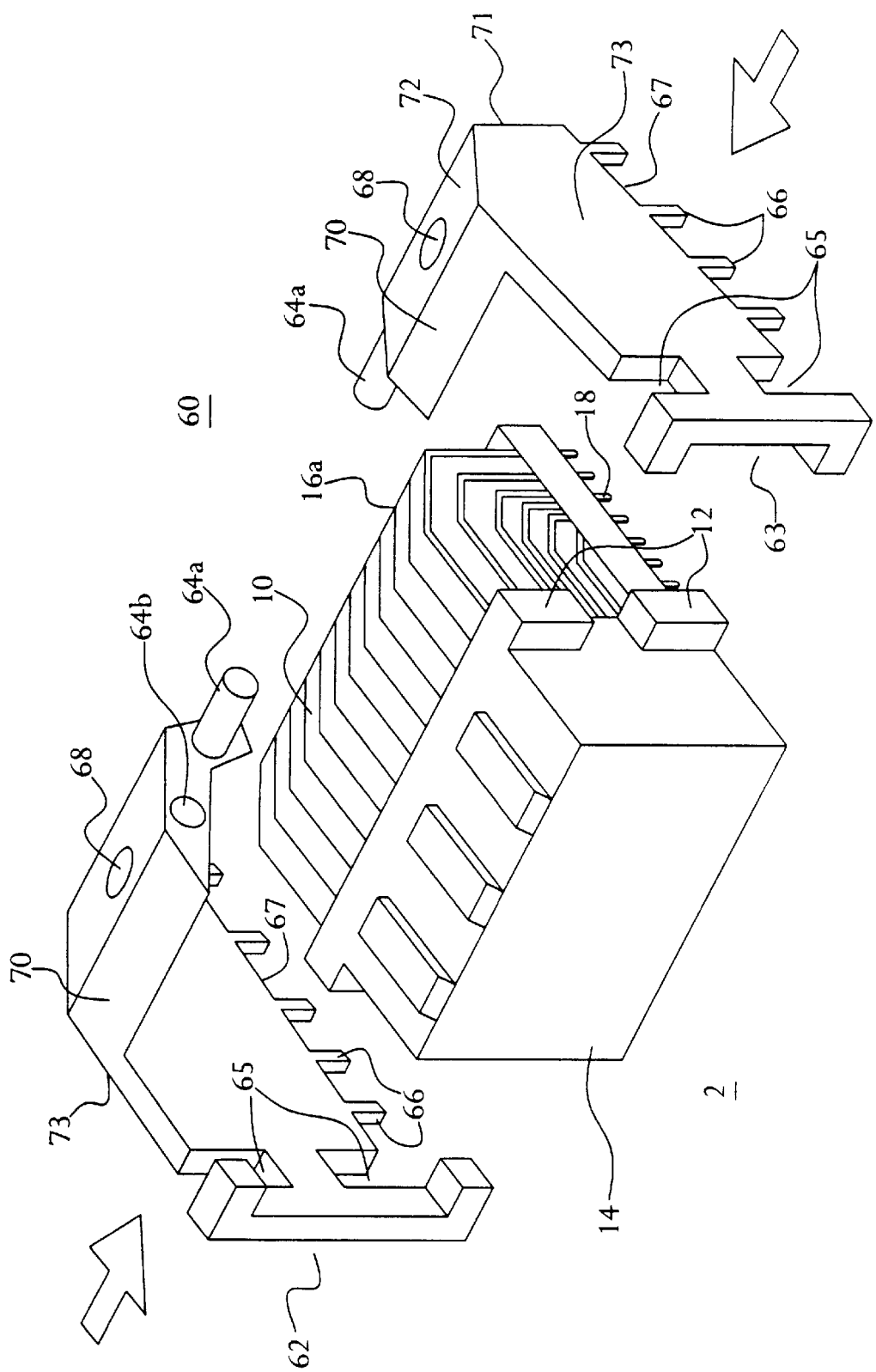
FIG. 8 is an exploded perspective view of a third alternative exemplary embodiment of an electrical connector assembly of the present invention.
Figure 9:
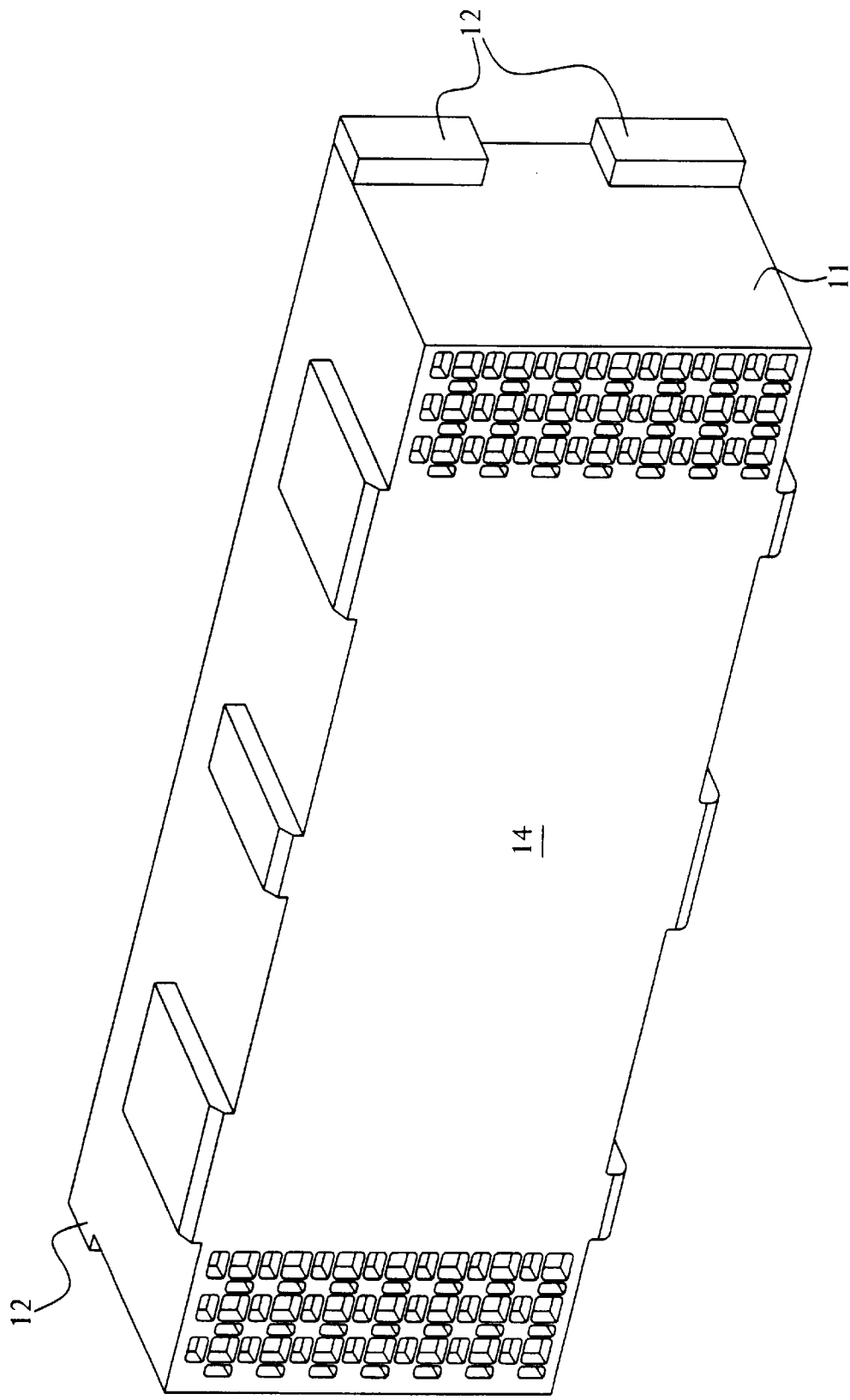
FIG. 9 is a perspective view of the connector module housing of FIG. 8.
Figure 10:
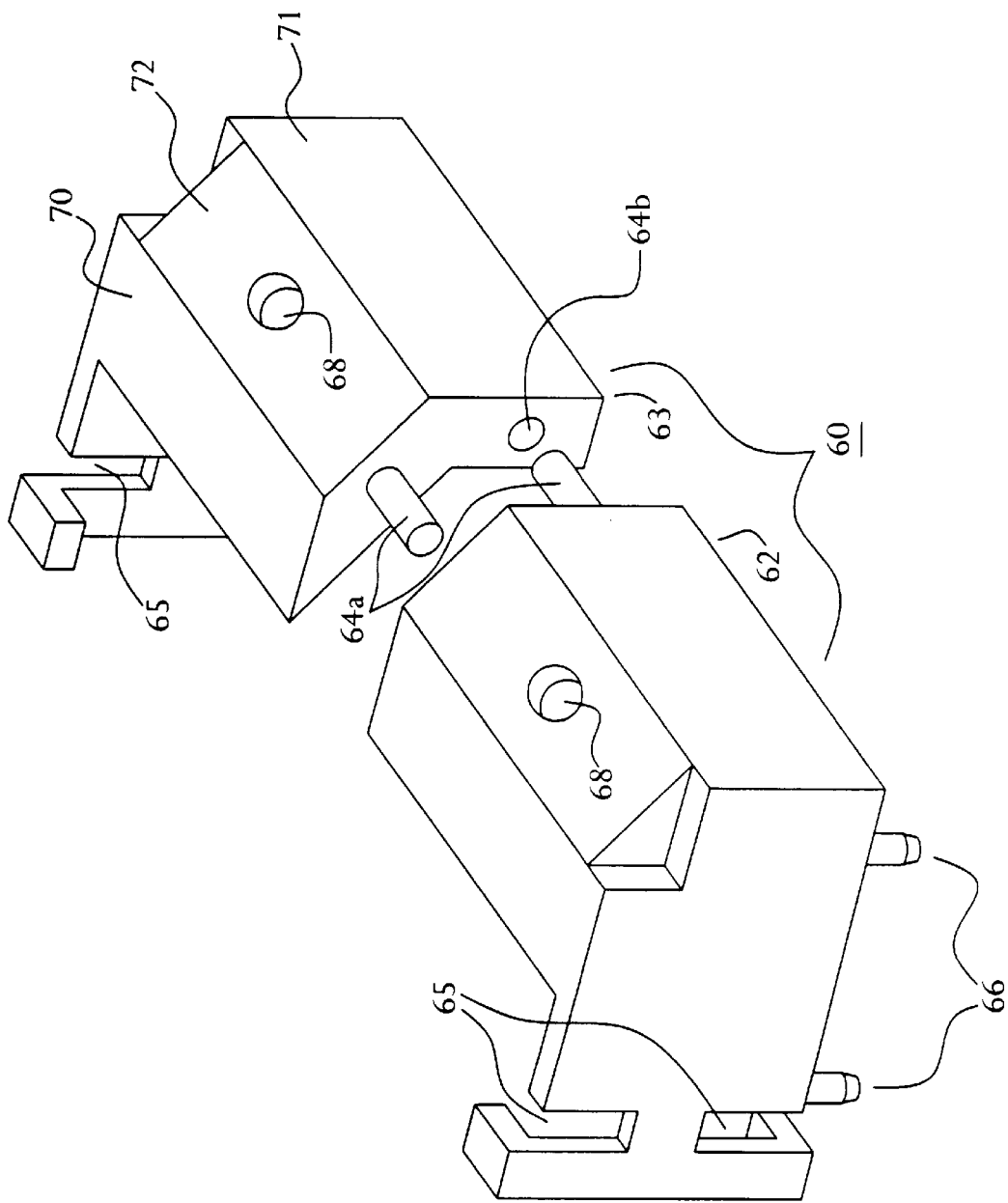
FIG. 10 is an exploded perspective view of the split body cover of FIG. 8.

As shown in FIGS. 8 and 10, connector cover 60 comprises a split body having a first half 62 and second half 63. Each half 62,63 has a top panel 70, a back panel 71, a sloped region 72 formed between the top panel 70 and the back panel 71, a side panel 73, and an alignment and attachment mechanism 64 for connecting the first half 62 to the second half 63. The halves 62,63 can also have alignment and retention features for connection to a PCB 5.

Preferably, halves 62 and 63 are joined by dowel pins 64a and corresponding recess 64b sized to provide an interference fit. It should be understood that any other suitable connecting means may be employed to connect halves 62 and 63 together. This split body design helps to facilitate the assembly and installation of cover 60 on to housing 14 over connector modules 10.

Cover 60 also includes a plurality of mounting projections 66 that act as alignment and retention features to couple the cover 60 to a PCB 5. Projections 66 preferably comprise a peg or dowel design. In one preferred embodiment, a plurality of pegs 66 are formed integral with cover 20 and are sized to form an interference fit or press-fit with corresponding recesses 6 in PCB 5, as shown in FIGS. 8 and 10.

Cover 60 also includes a retention structure for securing a stiffener rail 80 to cover 60 The retention structure may comprise part of the cover 60 or a separate structure disposed in or in the cover 60. In the split body design, this retention structure preferably consists of a plurality of holes 68 disposed in the cover 60. Retention structure 68 may be disposed on top panel 70, back panel 71, or preferably the sloped region 72 of connector cover 60.

Preferably, stiffener rail 80 is disposed directly on cover 60 proximate the sloped region 72 and back panel 71 and is coupled proximate the retention structure 68. Stiffener rail 80 may be used as a stiffener for connecting together one or more connectors 2 having a housing 14 and a cover 60 retaining modules 10 therein to form a larger connector assembly 3. The length of stiffener rail 80 may be changed to accommodate any desired number of connectors 2 depending on a particular need.

Figure 11:
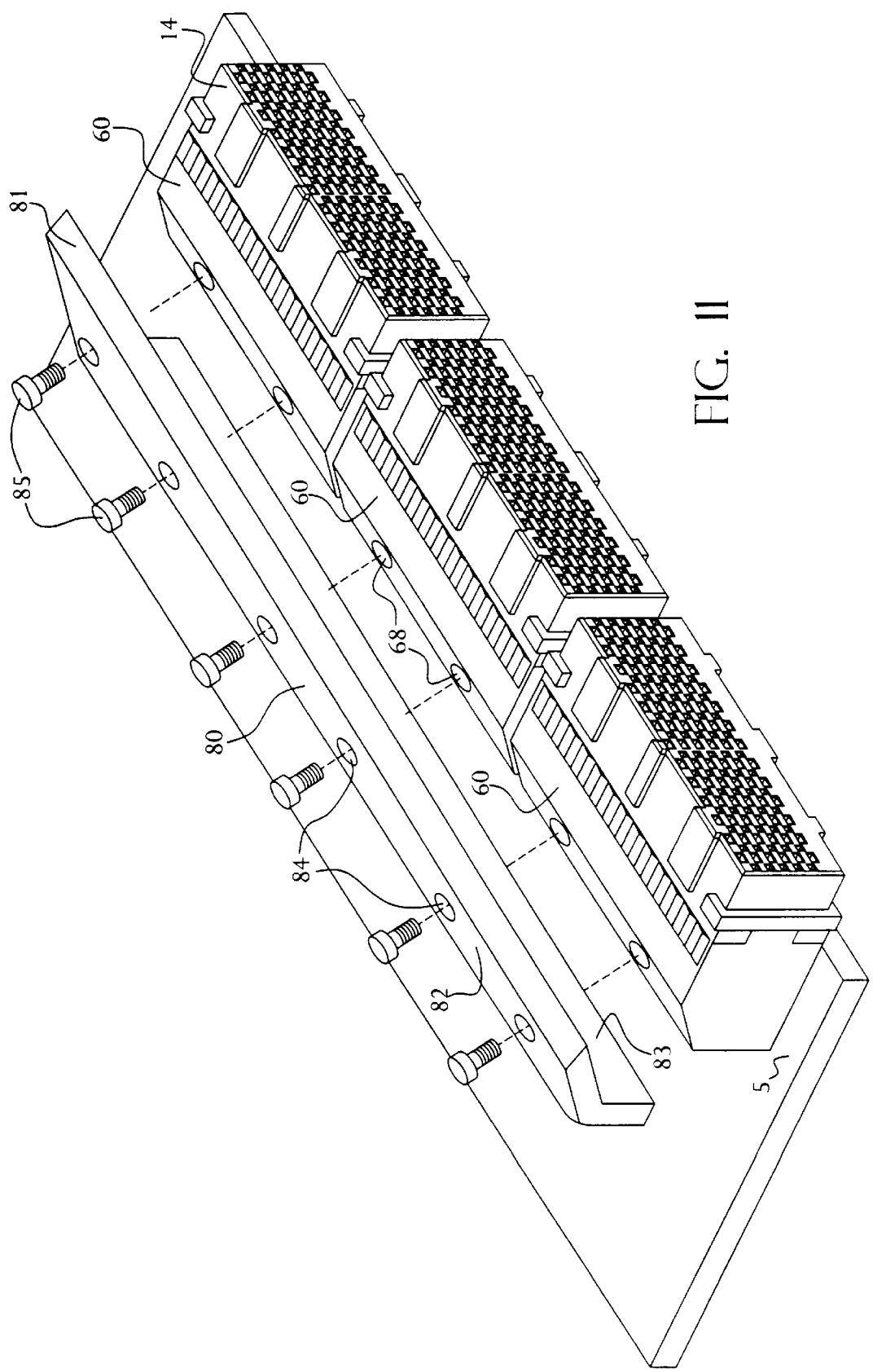
FIG. 11 is a perspective view of the cover of FIG. 8 showing an alternative stiffener embodiment.

FIG. 11 shows a perspective view of the stiffener rail 80 of the third alternative embodiment of this invention. As shown in FIG. 11, exemplary stiffener rail 80 is attached directly to the cover 60 and comprises a V-shaped body 81 having a first leg 82 and a second leg 83. The V-shaped body 81 forms an angle between first leg 82 and second leg 83 that conforms to the angle of cover 60 where sloped panel 72 and back panel 71 meet.

Preferably, first leg 82 has a plurality of holes 84 defined therein. Stiffener 80 is connected to cover 60 using a plurality of fasteners 85, such as threaded bolts. Through holes 84 of first leg 82 are sized large enough to allow the fastener 85 to pass there through, but small enough to allow the head of the fastener 85 to engage the top surface of first leg 82. Bolts 85 are screwed into threaded holes 68 formed in the cover 60 proximate the sloped panel 72. It should be understood that any other suitable connecting means may be employed to connect stiffener-rail 80 to cover 60, such as pegs, dowel pins, screws, bolts, clips, adhesive, welding, etc.

Preferably, stiffener rail 80 is made out of aluminum metal. The use of a metal stiffener is desired because of its strength characteristics. However, it is within the scope of the invention for the stiffener 80 to be formed from other materials.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector system, mountable on a circuit substrate, comprising:

a plurality of electrical connectors arranged adjacently, each including a front housing and a plurality of electrically conductive contacts extending rearwardly from said front housing;

a cover connected to said front housing and extending rearwardly to cover and contain said contacts; and a stiffener connected to said cover for securing said connectors together, wherein said stiffener is located away from said circuit substrate and said stiffener exhibits a stiffening effect which is operative on said cover, and wherein said stiffening effect is transposed through said cover to help stiffen and rigidify said circuit substrate.

2. The connection system as recited in claim 1, wherein said cover further comprises a top panel, a back panel, and two side panels, wherein a front end is generally open for mating with said front housing and a bottom end is generally open for mounting on said circuit substrate.

3. The connection system as recited in claim 16, further comprising a retention structure and a corresponding alignment structure formed between said cover and said stiffener for attaching said stiffener to said cover.

4. The connection system as recited in claim 3, wherein said retention structure comprises a projection extending from one surface of said cover and said corresponding alignment structure comprises a recess sized to receive said projection on said cover.

5. The connection system as recited in claim 3, wherein said retention structure and said alignment structure each comprise apertures that receive fasteners therein to secure said stiffener to said cover.

6. The connection system as recited in claim 3, wherein said retention structure is formed on said cover and said alignment structure corresponding to said retention structure is formed on said stiffener.

7. The connection system as recited in claim 1, wherein said stiffener does not engage said circuit substrate either directly or indirectly through any fastener or spacer means.

8. The connection system as recited in claim 1, wherein said stiffener indirectly engages said circuit substrate.

9. The connection system as recited in claim 1, wherein said cover is one-piece.

10. The connection system as recited in claim 1, wherein said cover is formed from two pieces, a first piece having an alignment structure for engaging an attachment structure of a second piece for holding said first piece and said second piece together.

11. The connection system as recited in claim 1, in combination with the circuit substrate, said cover mounted to said circuit substrate.

12. The connection system as recited in claim 1, wherein said cover further comprises a plurality of mounting projections extending from a bottom surface of said cover for connecting and holding said cover on said circuit substrate and for transposing said stiffening effect to said circuit substrate.

13. An electrical connector assembly for connecting to and stiffening a printed circuit board (PCB), said connector assembly comprising:

a socket housing having at least one shoulder disposed thereon, and at least one contact terminal disposed in said socket housing;

a cover disposed over at least a portion of said socket housing, said cover having at least one latch formed thereon, said latch being constructed to fit over and connectively engage said shoulder; and a stiffener coupled to said cover away from said PCB.

14. An electrical connector for use in establishing an electrical connection between a backplane and a printed circuit board, said connector comprising:

a connector module having a socket housing, at least one shoulder formed on said socket housing, said connector module being adapted for connection to said backplane;

a cover having a split body that is disposed over at least a portion of said socket housing, said split body having a first half and a second half, an attachment mechanism for connecting said first half to said second half, said split body being adapted for establishing a mechanical connection with a PCB; and a stiffener coupled to said cover away from said PCB.

15. A connection system, mountable on a circuit substrate, comprising:

a plurality of electrical connectors arranged adjacently, each including a front housing and a plurality of electrically conductive contacts extending rearwardly from said front housing;

a cover connected to said front housing and extending rearwardly to cover and contain said contacts; and a stiffener connected to said cover for securing said connectors together and indirectly connected to said circuit substrate for providing added rigidity to said circuit substrate, wherein said stiffener is connected to said circuit substrate proximate areas between adjacent connectors in areas of said circuit substrate having lower concentrations of electrical traces.

16. The connection system as recited in claim 15, wherein said areas between adjacent connectors in areas of said circuit substrate having lower concentrations of electrical traces are formed at a plurality of seams defined between side walls of adjacent connectors.

17. The connection system as recited in claim 15, further comprising one or more guides mountable to the circuit substrate and secured to said stiffener.

18. The connection system as recited in claim 17, wherein said guides include one or more posts and said stiffener includes one or more slots sized to receive said posts.

19. The connection system as recited in claim 17, further comprising one or more fasteners for securing said guide to said slot and to said circuit substrate.

* * * * *